(12) United States Patent
Tokita

(10) Patent No.: US 6,876,438 B2
(45) Date of Patent: Apr. 5, 2005

(54) SEMICONDUCTOR EXPOSURE APPARATUS, CONTROL METHOD THEREFOR, AND SEMICONDUCTOR DEVICE MANUFACTURING METHOD

(75) Inventor: Toshinobu Tokita, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/454,577

(22) Filed: Jun. 5, 2003

(65) Prior Publication Data

US 2003/0230730 A1 Dec. 18, 2003

(30) Foreign Application Priority Data

Jun. 13, 2002 (JP) ........................................ 2002-172829

(51) Int. Cl.[7] ........................ G03B 27/58; G03B 27/42
(52) U.S. Cl. ........................................ 355/72; 355/53
(58) Field of Search ............................... 355/53, 72–77; 356/399–401; 250/548

(56) References Cited

U.S. PATENT DOCUMENTS

| | | | | |
|---|---|---|---|---|
| 5,440,394 A | * | 8/1995 | Nose et al. | ............... 356/636 |
| 5,777,722 A | * | 7/1998 | Miyazaki et al. | ............. 355/53 |
| 5,959,304 A | | 9/1999 | Tokita et al. | ............ 250/492.2 |
| 6,151,120 A | * | 11/2000 | Matsumoto et al. | ........ 356/399 |
| 6,559,927 B1 | | 5/2003 | Tokita et al. | ................. 355/72 |
| 2002/0063221 A1 | * | 5/2002 | Li | ........................ 250/491.1 |
| 2003/0020891 A1 | | 1/2003 | Tokita | ........................ 355/53 |

FOREIGN PATENT DOCUMENTS

JP      2-100311      4/1990

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus performs a second transfer of a pattern of a second mask onto a second substrate, with the second substrate having a layer formed through a first transfer of a pattern of a first mask onto a first substrate. The apparatus includes a movable stage which holds the second substrate, and a measuring unit which measures a height of the second substrate relative to a plane at which the second substrate is to be exposed. In addition, a control unit controls a position of the stage based on the height measured by the measuring unit and a height of the first substrate previously measured relative to a plane at which the first substrate is to be exposed.

12 Claims, 8 Drawing Sheets

WAFER PROCESS

SEMICONDUCTOR EXPOSURE APPARATUS, CONTROL METHOD THEREFOR, AND SEMICONDUCTOR DEVICE MANUFACTURING METHOD

FIELD OF THE INVENTION

The present invention relates to a semiconductor exposure apparatus, a control method therefor, and a semiconductor device manufacturing method.

BACKGROUND OF THE INVENTION

Typical proximity exposure apparatuses, which perform exposure by bringing a mask (master) and a substrate such as a wafer, or the like, close to each other, include an X-ray exposure apparatus. For example, an X-ray exposure apparatus using an SR light source is disclosed in Japanese Patent Laid-Open No. 2-100311.

FIG. 1 is a schematic view showing a general arrangement of a conventional X-ray exposure apparatus of this type. In FIG. 1, a mask 101 with a patterned mask membrane 102 is held by a mask chuck 104 mounted on a mask stage base 106 and aligned with respect to an X-ray optical path. A wafer 103 is held by a wafer chuck 105, faces the mask 101, and is spaced apart from the mask 101 by an infinitesimal distance, i.e., arranged close to the mask 101. The wafer chuck 105 is mounted on a fine adjustment stage 113 used to align the mask 101 and wafer 103. The wafer chuck 105 and fine adjustment stage 113 are mounted on a coarse adjustment stage 112 used for movement between shots so that the irradiation region of X-ray beams can be sequentially stepped over a plurality of field angles of exposure of the wafer 103. The coarse adjustment stage 112 is guided by a stage base 107. An alignment scope 108 is designed to measure the amount of shift between the mask 101 and the wafer 103 in their alignment and is mounted on an alignment stage 109. The alignment stage 109 is mounted on the mask stage base 106 and is used to move alignment light emitted from the alignment scope 108 to an alignment mark position (not shown) formed on the mask membrane 102.

Generally, in an X-ray exposure apparatus, the mask membrane 102 and wafer 103 are spaced apart from each other by an infinitesimal distance of 10 to 30 $\mu$m to face each other, and exposure (proximity exposure) is performed using the step & repeat scheme, in which exposure of the wafer 103 to the pattern on the mask membrane 102 is repeated a plurality of number of times.

The procedure for performing exposure by global alignment in this conventional X-ray exposure apparatus will be described below.

(1) The coarse adjustment stage 112 is driven such that the first shot of the wafer 103 in global alignment is located below the mask membrane 102.

(2) The fine adjustment stage 113 drives the wafer 103 such that the distance (to be referred to as a gap hereinafter) between the mask 101 and the wafer 103 changes from the gap for stepping to the gap for gap measurement and performs gap measurement by the alignment scope 108.

(3) After the fine adjustment stage 113 makes the wafer 103 parallel to the mask 101, a measuring unit (not shown) measures a shift in the in-plane direction between the mask 101 and the wafer 103 at a plurality of points, and a controller (not shown) calculates the correction amount of the positional shift of each shot.

(4) The coarse adjustment stage 112 drives the wafer 103 such that the first shot of the wafer 103 in exposure is located below the mask membrane 102. After the fine adjustment stage 113 corrects the in-plane positional shift of the shot, the fine adjustment stage 113 adjusts the gap so as to equal the gap for exposure.

(5) The X-ray exposure apparatus performs exposure.

(6) The fine adjustment stage 113 adjusts the gap so as to equal the gap for stepping, and the coarse adjustment stage 112 steps the wafer 103 to the second shot in exposure.

The X-ray exposure apparatus performs exposure for a predetermined number of shots of the wafer 103 by repeating the steps (4) to (6) in the same manner.

However, a conventional X-ray exposure apparatus does not take any measurement error induced by a wafer process into consideration in gap measurement, posing the following problems.

When gap setting is performed on the basis of the measurement result including any measurement error induced by the wafer process, an error occurs in gap setting by the magnitude corresponding to the measurement error. As a result, imaging performance degrades and overlay accuracy decreases. Note that in this specification, measurement errors induced by the process include ones due to unevenness of the wafer surface (e.g., unevenness of the pattern, defects due to a foreign substance, roughness of the wafer surface, unevenness of the reverse surface of the photoresist applied to the wafer surface, and the like). Additionally, these problems are not limited to the proximity scheme. For example, similar problems arise in, e.g., AF measurement by reduction projection exposure using an excimer laser as a light source.

Generally, in reduction projection exposure, AF measurement is performed by diagonally projecting light onto the wafer surface and detecting its reflection light as the height of the wafer surface using a CCD, or the like. In this method as well, the wafer process induces measurement errors. For this reason, a preceding wafer is used to perform pre-exposure, thereby determining the best focus from the exposure result, for each wafer layer (exposure step). In actual exposure, any measurement error is reflected as an offset value in AF measurement or AF setting on the basis of the best focus.

However, as described above, a method of exposing a preceding wafer to obtain an offset value poses a problem that the operating time of the exposure apparatus shortens to reduce the productivity of devices.

SUMMARY OF THE INVENTION

The present invention has been made in consideration of the above-mentioned problems, and has as its object to increase the productivity of devices.

According to the first aspect of the present invention, there is provided a semiconductor exposure apparatus for tranfering a pattern of a master onto a wafer, comprising a measuring unit which measures wafer height information, and an adjustment unit which adjusts a position of the master in a direction of height and/or a position of the wafer in a direction of height on the basis of wafer height information in a preceding exposure step and wafer height information in a current exposure step.

According to a preferred embodiment of the present invention, the apparatus preferably further comprises a processor which stores the wafer height information in a memory.

According to a preferred embodiment of the present invention, the processor preferably associates the wafer height information with identification information for identifying the wafer to store the associated information in the memory.

According to a preferred embodiment of the present invention, the processor preferably reads out the wafer height information in the preceding exposure step from the memory on the basis of the identification information.

According to a preferred embodiment of the present invention, the processor preferably stores in the memory at least one of a height of the wafer from a predetermined reference position and an amount of adjustment by the adjustment unit as the wafer height information.

According to a preferred embodiment of the present invention, the apparatus preferably further comprises a controller which outputs a command value for controlling the adjustment unit on the basis of the wafer height information in the preceding exposure step and the wafer height information in the current exposure step.

According to a preferred embodiment of the present invention, the apparatus preferably further comprises a controller, which has a function of, when a difference between the wafer height information in the preceding exposure step and the wafer height information in the current exposure step is not less than a predetermined value, stopping operation of the apparatus.

According to a preferred embodiment of the present invention, the controller preferably performs an operation of adding the wafer height information in the preceding exposure step and the wafer height information in the current exposure step in a predetermined ratio, and the adjustment unit preferably adjusts the position of the master in the direction of the height and/or the position of the wafer in the direction of heights, on the basis of the operation result obtained by the controller.

According to a preferred embodiment of the present invention, the controller preferably has an evaluation function for changing the ratio in accordance with each exposure step on the basis of the wafer height information in the preceding exposure step and the wafer height information in the current exposure step.

According to a preferred embodiment of the present invention, the adjustment unit preferably adjusts the position of the master in the direction of the height and/or the position of the wafer in the direction of height such that a distance between the master and the wafer equals a predetermined infinitesimal distance.

According to a preferred embodiment of the present invention, the adjustment unit preferably adjusts the position of the master in the direction of the height and/or the position of the wafer in the direction of the height such that the position of the wafer in the direction of the height equals a focus position of the exposure light.

According to the second aspect of the present invention, there is provided a method of controlling an exposure apparatus for transferring a pattern of a master onto a wafer, comprising a measurement step of measuring wafer height information, and an adjustment step of adjusting a position of the master in a direction of the height and/or a position of the wafer in a direction of the height on the basis of wafer height information in a preceding exposure step and wafer height information in a current exposure step.

According to the third aspect of the present invention, there is provided a semiconductor device manufacturing method comprising a coating step of coating a substrate with a photosensitive agent, an exposure step of transferring a pattern onto the substrate coated with the photosensitive agent in the coating step using a semiconductor exposure apparatus according to the present invention, and a development step of developing the photosensitive agent on the substrate, onto which the pattern is transferred in the exposure step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

First Embodiment

Figure 1:
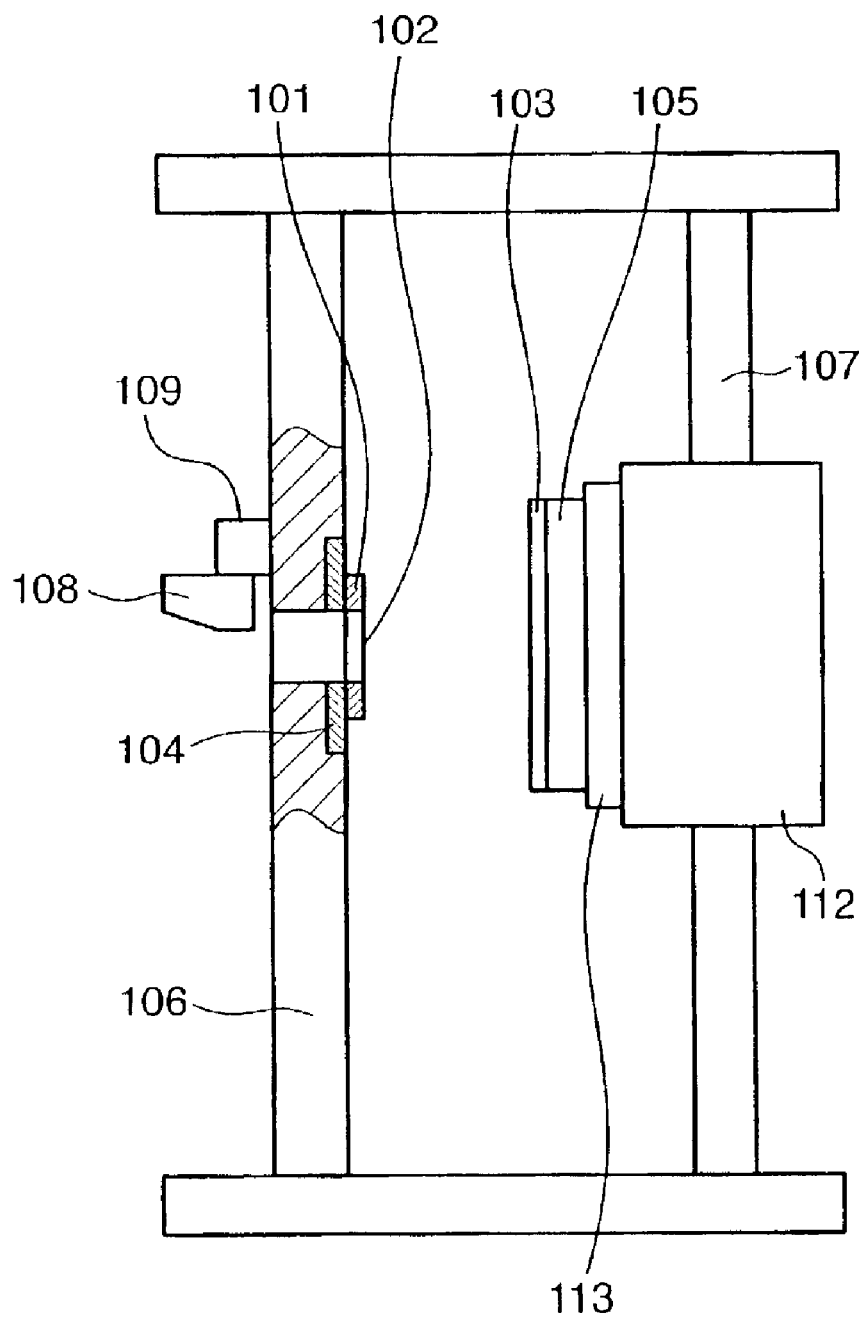
FIG. 1 is a schematic view showing a general arrangement of a conventional X-ray exposure apparatus.
Figure 2:
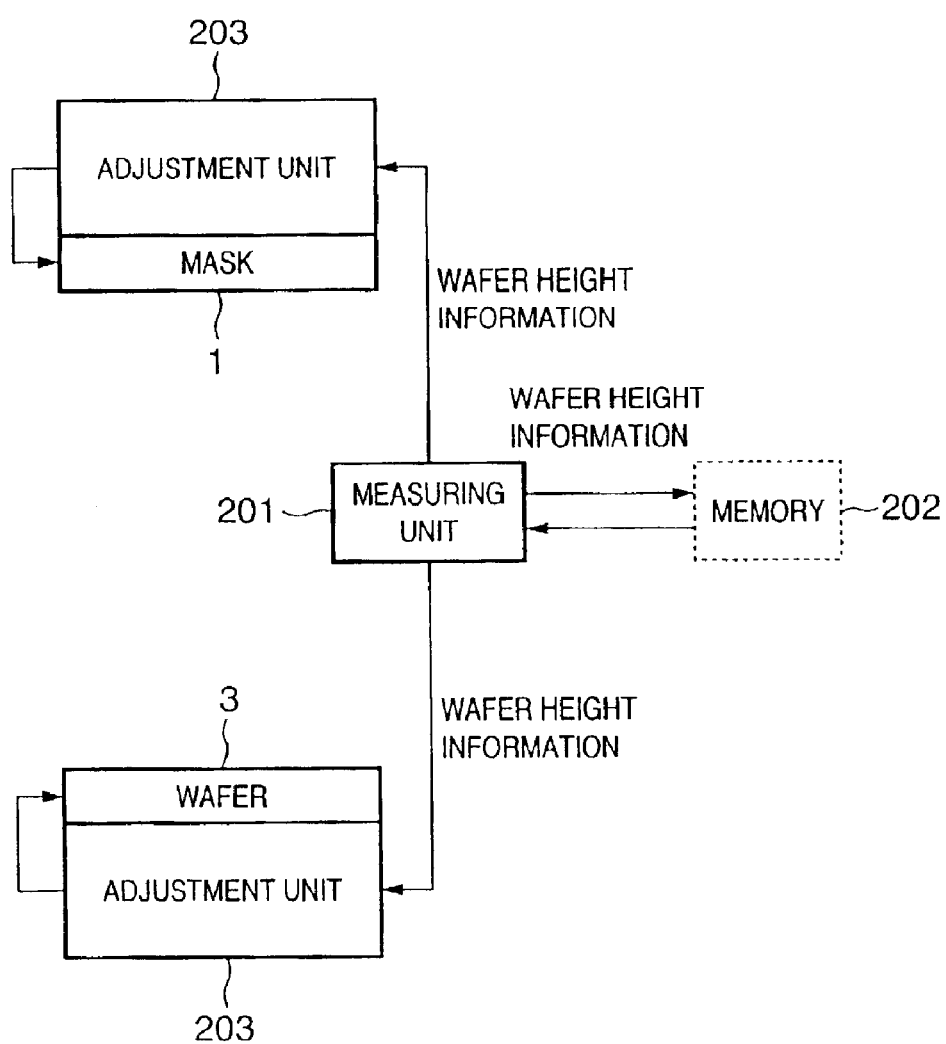
FIG. 2 is a schematic view showing part of the arrangement of a semiconductor exposure apparatus according to a preferred embodiment of the present invention.

FIG. 2 is a schematic view showing a part of the arrangement of a semiconductor exposure apparatus according to a preferred embodiment of the present invention.

In the semiconductor exposure apparatus shown in FIG. 2, exposure light emitted from an optical system (not shown) irradiates a mask 1, and the pattern image of the mask 1 is formed on a wafer 3. A measuring unit 201 measures the positions of the mask 1 and/or the wafer 3 in their respective directions of height and stores the management result in a memory 202. The memory 202 may be provided in or outside the semiconductor exposure apparatus. The above-mentioned measurement result may temporarily be stored in a memory within the semiconductor exposure apparatus and then transferred to a memory provided outside the semiconductor exposure apparatus. Adjustment units 203 have a function of adjusting the positions of the mask 1 and/or the wafer 3 in their respective directions of height. The adjustment unit 203 on the wafer side can comprise, e.g., a wafer chuck, which holds the wafer, and/or a Z tilt stage, which moves the wafer in its direction of height. The adjustment unit 203 on the mask side can comprise, e.g., a mask chuck, which holds the mask, and/or a mask stage, which moves the mask in its direction of height. The adjustment units 203 adjust the positions of the mask 1 and/or the wafer 3 in their respective directions of height on the basis of the wafer height information in the current exposure step obtained by the measuring unit 201 and that in past exposure steps stored in, e.g., the memory 202.

Figure 3:
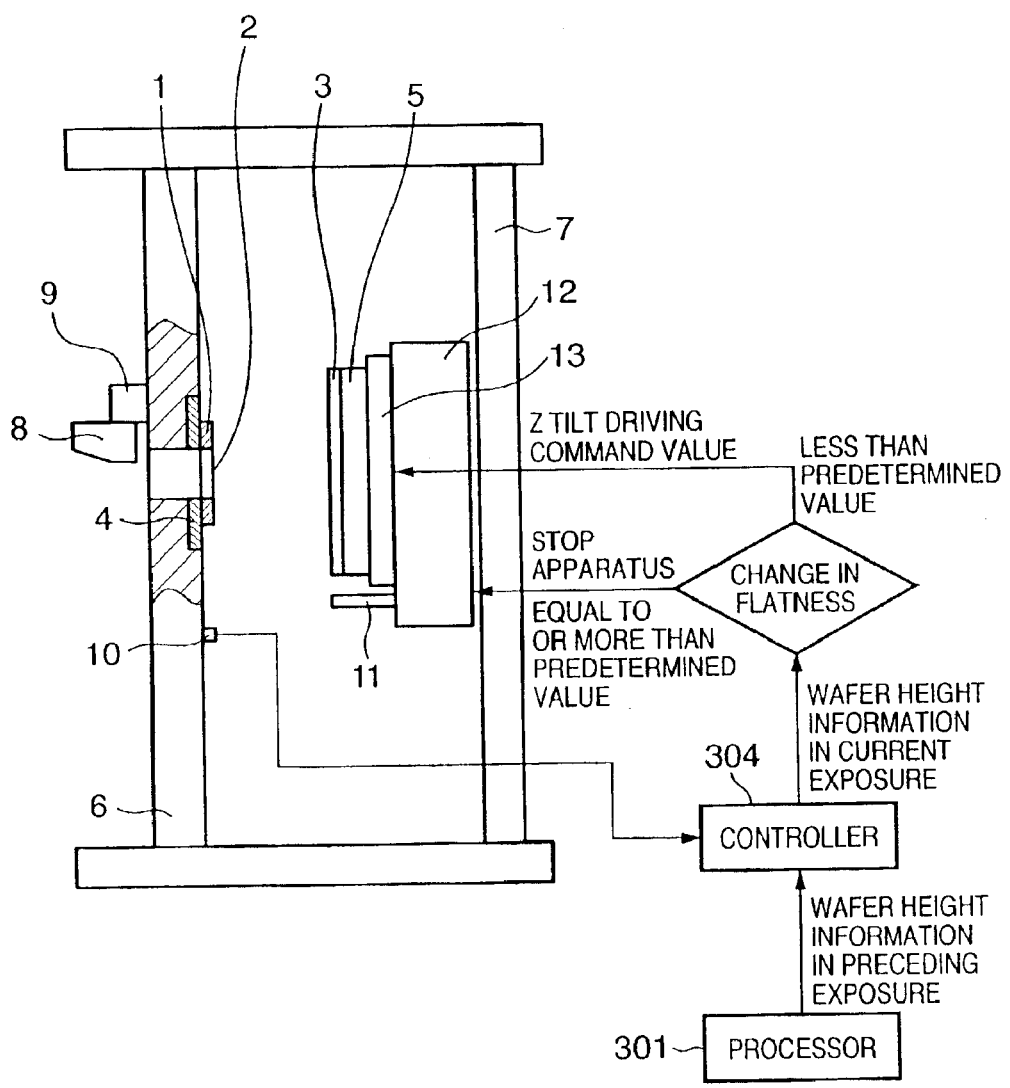
FIG. 3 is a view for explaining exposure operation by global alignment in the semiconductor exposure apparatus according to the preferred embodiment of the present invention.

FIG. 3 is a view for explaining an exposure operation by global alignment in the semiconductor exposure apparatus according to the preferred embodiment of the present invention. In FIG. 3, the mask 1 with a mask membrane 2 on which a pattern is formed is held by a mask stage 4 with a mask chuck mounted on a mask stage base 6. The mask 1 is aligned with respect to an X-ray optical path. The wafer 3 serving as a substrate, which faces the mask 1 and is spaced apart from the mask 1 by an infinitesimal distance, i.e., arranged close to the mask 1, is held by a wafer chuck 5. The wafer chuck 5 is mounted on a Z tilt stage 13 used to align the mask 1 and wafer 3. In addition, the wafer chuck 5 and Z tilt stage 13 are mounted on an X-Y stage 12 used for movement between shots so that the irradiation region of X-ray beams can be sequentially stepped over a plurality of field angles of exposure of the wafer 3. The X-Y stage 12 is guided by a stage surface plate 7. An alignment scope 8 is designed to measure the amount of shift between the mask 1 and the wafer 3 in their alignment and is mounted on an alignment stage 9. The alignment stage 9 is designed to align the alignment scope 8 such that alignment light emitted from the alignment scope 8 strikes an alignment mark (not shown) formed on the mask membrane 2 and is mounted on the mask stage base 6. Though FIG. 3 shows one set of the alignment scope 8 and the alignment stage 9, the semiconductor exposure apparatus may have two or more sets of alignment scopes and alignment stages. Generally, as semiconductor exposure apparatus has three or more sets. A wafer height sensor 10 is designed to measure the position of the wafer in its direction of height and to inform a controller 304 of the height information of the wafer. The wafer height sensor 10 is mounted on the mask stage base 6. A mask height sensor 11 is designed to measure the position of the mask in its direction of height and is mounted on the X-Y stage 12. Though FIG. 3 shows only one wafer height sensor 10, the present invention is not limited to this. A plurality of wafer height sensors may be provided.

A processor 301 has a function of managing for each wafer the wafer height information at the time of exposure in the preceding layers (exposure steps). The processor 301 can manage the wafer height information by, e.g., having a function of associating the height information of each wafer with identification information for identifying the wafer to store the associated information in a memory (not shown) and reading out the wafer height information in the preceding exposure steps from the memory on the basis of the identification information. The controller 304 outputs command values (e.g., a Z tilt correction amount for the Z tilt stage 13) for controlling an adjustment unit (e.g., the Z tilt stage 13) on the basis of the wafer height information in the preceding exposure steps which the processor 301 manages within the memory (not shown) and the current wafer height information obtained by the wafer height sensor 10. A console (not shown) can be provided with the functions to be assigned to the processor 301 or controller 304.

Figure 4:
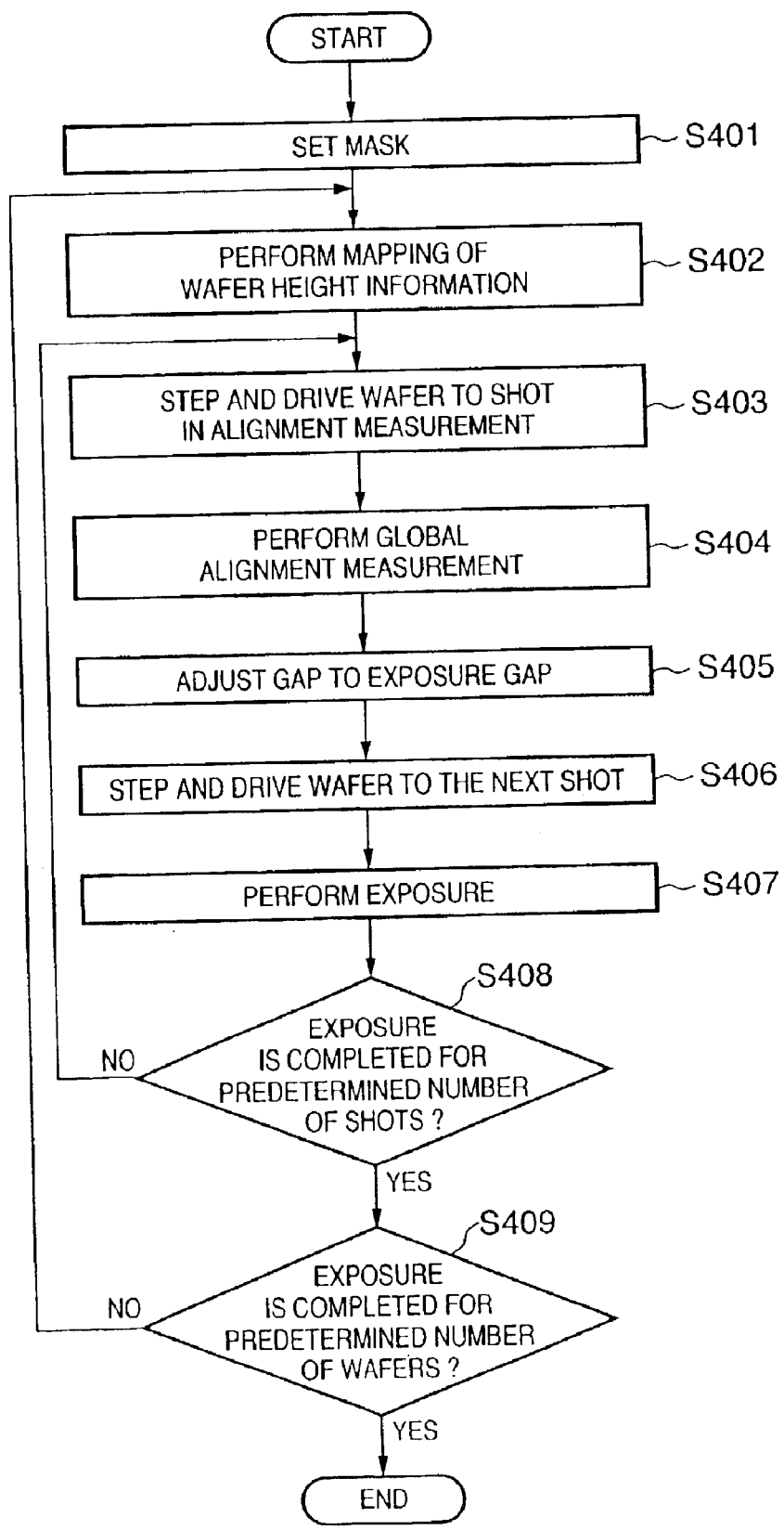
FIG. 4 is a flow chart of the exposure operation by global alignment in the semiconductor exposure apparatus according to the preferred embodiment of the present invention.

With the above-mentioned arrangement, the procedure for performing exposure by global alignment will be described below. FIG. 4 is a flow chart of an exposure operation by global alignment using the semiconductor exposure apparatus shown in FIG. 3. Let n be the number of the current layer (exposure step) at this time, and (n−1) be the number of the immediately preceding layer (exposure step). Assume that the mask 1 and wafer 3 are not held by the mask chuck 4 and wafer chuck 5 in the initial state.

In step S401, the mask 1 is set at a predetermined position. More specifically, the mask 1 is first conveyed to the mask chuck 4 and held by the mask chuck 4. Then, the mask height sensor 11 measures the position of the mask 1 in its direction of height, and the mask stage 4 aligns the mask 1 at the predetermined position with respect to a predetermined reference position (apparatus reference) on the basis of the measurement result. Note that since the apparatus reference is a virtual reference, it is not shown in FIG. 3. The X-Y stage 12 is driven such that a reference mark base (not shown) mounted on the X-Y stage 12 is located below the mask membrane 2. The alignment stage 9 adjusts the position of the alignment scope 8 such that alignment light emitted from the alignment scope 8 passes through an alignment mark on the mask membrane 2, is reflected on the reference mark base, and returns to the alignment scope 8.

In step S402, the wafer height sensor 10 performs mapping of the wafer height information. More specifically, the wafer chuck 5 first holds the loaded wafer 3. The wafer height sensor 10 measures the position of the wafer 3 in its direction of height and performs mapping of the height from the apparatus reference. At this stage, the positional relationship between the mask 1 or wafer 3 and the apparatus reference is obtained, and gap measurement ends. Mapping includes the following steps. The controller 304 determines the Z tilt correction amount of the Z tilt stage 13 in gap setting on the basis of the nth wafer height information obtained by the wafer height sensor 10 and preceding height information up to the (n−1)th height information of the same wafer already obtained by the processor 301. This determination may be performed by, e.g., adding the nth wafer height information and the preceding height information up the (n−1)th wafer height information in a predetermined ratio. The controller 304 calculates a difference (change in flatness) between the nth wafer height information and the preceding height information up to the (n−1)th wafer height information. If the difference is equal to or more than a predetermined value, the operation of the apparatus is preferably stopped. In this case, a foreign substance, or the like, may be present on the reverse surface of the wafer 3. The user preferably performs maintenance, such as cleaning of the wafer chuck 5, and the like.

In step S403, the X-Y stage 12 drives the wafer 3 such that a predetermined shot of the wafer 3 is located under the mask membrane 2 in global alignment measurement. Additionally, at this time, the Z tilt stage 13 preferably adjusts the position of the wafer 3 in the direction of the height such that the gap equals the alignment gap (e.g., 25 $\mu$m).

In step S404, the X-Y stage 12 aligns the wafer 3 at each shot position in global alignment measurement, while keeping the alignment gap, and global alignment is performed in this state.

In step S405, after the global alignment measurement, the Z tilt stage 13 adjusts the position of the wafer 3 in the direction of the height, such that the gap equals the exposure gap (e.g., 10 $\mu$m).

In step S406, the X-Y stage 12 aligns the wafer 3 at a predetermined shot position on the basis of the measurement result of the global alignment measurement while keeping the exposure gap.

In step S407, the semiconductor exposure apparatus performs exposure.

In step S408, the controller 304 of the semiconductor exposure apparatus determines whether exposure is completed for a predetermined number of shots. If exposure is completed for the predetermined number of shots (YES in step S408), the flow advances to step S409. If exposure is not completed for the predetermined number of shots (NO in step S408), the flow returns to step S406, and exposure processing is performed for the next shot.

In step S409, the controller 304 of the semiconductor exposure apparatus determines whether exposure is completed for a predetermined number of shots in the current exposure step. If exposure is completed for the predetermined number of shots (YES in step S409), the exposure processing ends. If exposure is not completed for the predetermined number of shots (NO in step S409), the flow returns to step S402, and exposure processing is performed for the next shot.

In the above description, the controller 304 determines the Z tilt correction amount by adding the nth wafer height information and the preceding height information to the (n−1)th wafer height information in a predetermined ratio. However, the present invention is not limited to this. The controller 304 may have an evaluation function for changing the ratio in accordance with each exposure step on the basis of the wafer height information in the preceding exposure steps and that in the current exposure step. For example, to determine the Z tilt correction amount, an evaluation function may be prepared to change the ratio of the nth wafer height information and the preceding height information up to the (n−1)th wafer height information in accordance with each layer (exposure step). In addition, as the preceding height information up to the (n−1)th wafer height information, any of the first height information to the (n−1)th height information of the wafer may be employed. As the preceding height information up the (n−1)th height information, the (n−1)th height wafer information, which is closest to the height information of the nth wafer to be exposed, is preferably employed. However, if the thickness of the layer, that of the resist, and the like, in each of the first to the (n−1)th wafers are known, any of the first wafer height information to the (n−1)th wafer height information may be employed. In this case, the known thickness information of each layer and the resist may preferably be added to the wafer height information to manage the resultant information in a memory (not shown) by the processor 301.

The wafer height information is not limited to the height information using the apparatus reference. For example, the correction amount in the Z tilt stage 13 may represent the wafer height information and be managed. In this case, the controller 304 may convert the nth wafer height information to the Z tilt correction amount and add the obtained Z tilt correction amount to the Z tilt correction amount up to the (n−1)th Z tilt correction amount in a predetermined ratio.

Moreover, in the above description, the wafer height sensor 10 measures the height of the wafer 3 and then performs mapping of the height from the apparatus reference. However, the present invention is not limited to this. For example, this embodiment can be applied to a case wherein AF measurement is performed by die-by-die. In this case, since AF measurement is performed for every gap setting, the wafer height sensor 10 is not necessarily used. For example, the alignment scope 8 preferably directly performs AF measurement.

In this embodiment, a console (not shown) can be provided with the functions to be assigned to the processor 301 or controller 304, as described above. However, this embodiment is not limited to this. A computer other than the console may have these functions. Additionally, in the above description, the controller 304 determines whether the difference between the nth wafer height information and wafer height information up to the (n−1)th wafer height information is equal to or more than a predetermined value in the processing flow of the wafer height information and the Z tilt correction amount information in FIG. 3. However, the present invention is not limited to this. For example, another controller connected to the controller 304 may have this determination function. The controller 304 may determine the Z tilt correction amount after this determination. Alternatively, the controller 304 may determine the Z tilt correction amount only if the difference between the nth wafer height information and the wafer height information up to the (n−1)th wafer height information is equal to or less than the predetermined value.

In this embodiment, the wafer height information is described in consideration of AF measurement by mapping or die-by-die. However, this embodiment is not limited to this. For example, this embodiment can be applied to a case wherein focus alignment is performed simultaneously with AF measurement in real time, as shown in FIG. 5.

Figure 5:
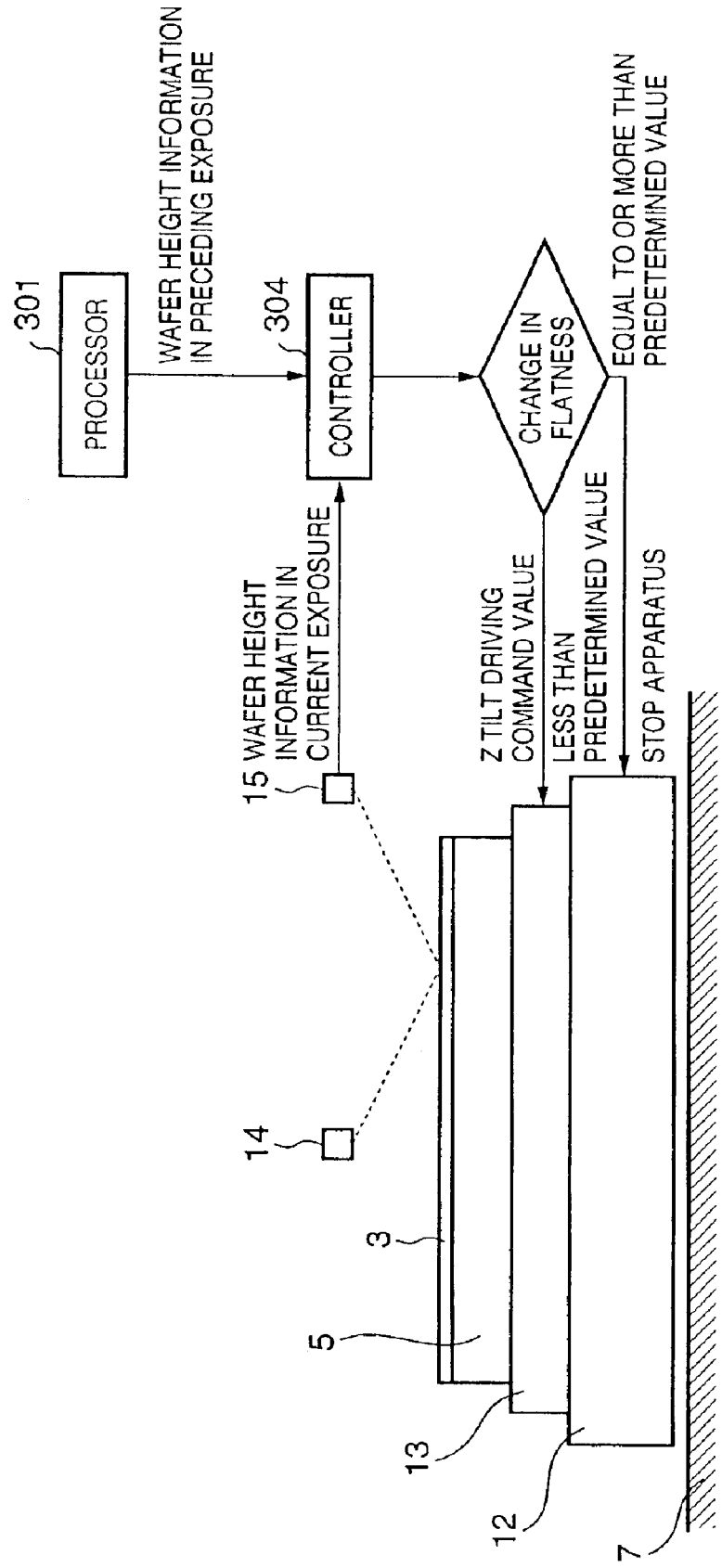
FIG. 5 is a schematic view showing an AF measurement exposure operation in the semiconductor exposure apparatus according to the preferred embodiment of the present invention.

FIG. 5 shows an operation obtained by adding the characteristic features of the present invention to AF measurement by general reduction projection exposure. In FIG. 5, the wafer 3 serving as a substrate is held by the wafer chuck 5. The wafer chuck 5 is mounted on the Z tilt stage 13 used to align the wafer 3. The wafer chuck 5 and Z tilt stage 13 are mounted on the X-Y stage 12 used for movement between shots so that the irradiation region of exposure light can be sequentially stepped or scanned over a plurality of field angles of exposure of the wafer 3. The X-Y stage 12 is guided by the stage surface plate 7. To obtain the wafer height information, a light-projecting unit 14 diagonally projects light onto the surface of the wafer, and a light-receiving unit 15 receives light reflected by the wafer 3. The light-receiving unit 15 incorporates a CCD, or the like, and calculates the height of the wafer 3 from the barycentric position of the reflected light. The device to be incorporated in the light-receiving unit 15 is not limited to the CCD. For example, a PSD may be incorporated instead. Additionally, the light-projecting unit 14 preferably projects light using an LD, LED, or the like. The processor 301 manages for each wafer the wafer height information obtained when the preceding layers (exposure steps) are exposed. The processor 301 manages the wafer height information by, e.g., having a function of associating the height information of each wafer with identification information for identifying the wafer to store the associated information in a memory (not shown) and reading out the wafer height information in the preceding exposure step from the memory on the basis of the identification information. Though FIG. 5 shows only one set of the light-projecting unit 14 and the light-receiving unit 15, the semiconductor exposure apparatus may have a plurality of sets. The controller 304 outputs command values (e.g., a Z tilt correction amount for the Z tilt stage 13) for controlling an adjustment unit (e.g., the Z tilt stage 13) on the basis of the wafer height information in the preceding exposure step managed by the processor 301 and the current wafer height information obtained by the light-receiving unit 15. A console (not shown) can be provided with the functions to be assigned to the processor 301 or controller 304.

The first embodiment will be described next with reference to FIG. 5, wherein focus alignment is performed simultaneously with AF measurement in real time, thereby exposing the nth layer (exposure step).

The light-projecting unit 14 and the light-receiving unit 15 measure the height of the first shot or its vicinity of the wafer 3. The controller 304 determines the Z tilt correction amount of the Z tilt stage 13 on the basis of the obtained wafer height information and, e.g., wafer height information up to the (n−1)th height information of the same wafer already obtained by the processor 301.

In the above description, the controller 304 determines the Z tilt correction amount by adding the nth wafer height information and, e.g., the wafer height information up to the (n−1)th wafer height information of the same wafer in a predetermined ratio. However, the present invention is not limited to this. The controller 304 may have an evaluation function for changing the ratio in accordance with each exposure step on the basis of the wafer height information in the preceding exposure steps and that in the current exposure step. For example, to determine the Z tilt correction amount, an evaluation function may be prepared to change the ratio of the nth wafer height information and the wafer height information up to the (n−1)th wafer height information in accordance with each layer (exposure step).

In addition, as the wafer height information up to the (n−1)th wafer height information, any of the first wafer height information to the (n−1)th wafer height information may be employed. The correction amount in the Z tilt stage 13 may represent the wafer height information and be managed.

The controller 304 calculates a difference (change in flatness) between the nth wafer height information and the wafer height information up to the (n−1)th wafer height information. If the difference is equal to or more than a predetermined value, the operation of the apparatus is preferably stopped. In this case, a foreign substance, or the like, may be present on the reverse surface of the wafer 3. The user preferably performs maintenance including cleaning of the wafer chuck 5.

In this embodiment, a console (not shown) can be provided with the functions to be assigned to the processor 301 or controller 304, as described above. However, this embodiment is not limited to this. A computer other than the console may have these functions. Additionally, in the above description, the controller 304 determines whether the difference between the nth wafer height information and the wafer height information up to the (n−1)th wafer height information is equal to or more than a predetermined value in the flow of the wafer height information and the Z tilt correction amount information in FIG. 5. However, another controller connected to the controller 304 may have this determination function. The controller 304 may determine the Z tilt correction amount after this determination. Alternatively, the controller 304 may determine the Z tilt correction amount only if the difference between the nth wafer height information and the wafer height information up to the (n−1)th wafer height information is equal to or less than the predetermined value.

Second Embodiment

The first embodiment has described that all the layers (exposure steps) are exposed by one exposure apparatus. On the contrary, in the second embodiment, an arrangement which supports the mix and match scheme will be described, with reference to FIG. 6. Though focus alignment simultaneously with AF measurement in real time, described in the first embodiment, will be explained here by applying FIG. 5, this embodiment can also be applied to the exposure apparatus using the mapping scheme described with reference to FIG. 3. In addition, this embodiment can be applied to the mix and match scheme, which combines the mapping scheme, die-by-die scheme, and real-time scheme. In the same manners as in the first embodiment, let n be the number of a layer (exposure step) to be exposed this time, and (n−1) be the number of an immediately preceding exposed layer (exposure step).

Figure 6:
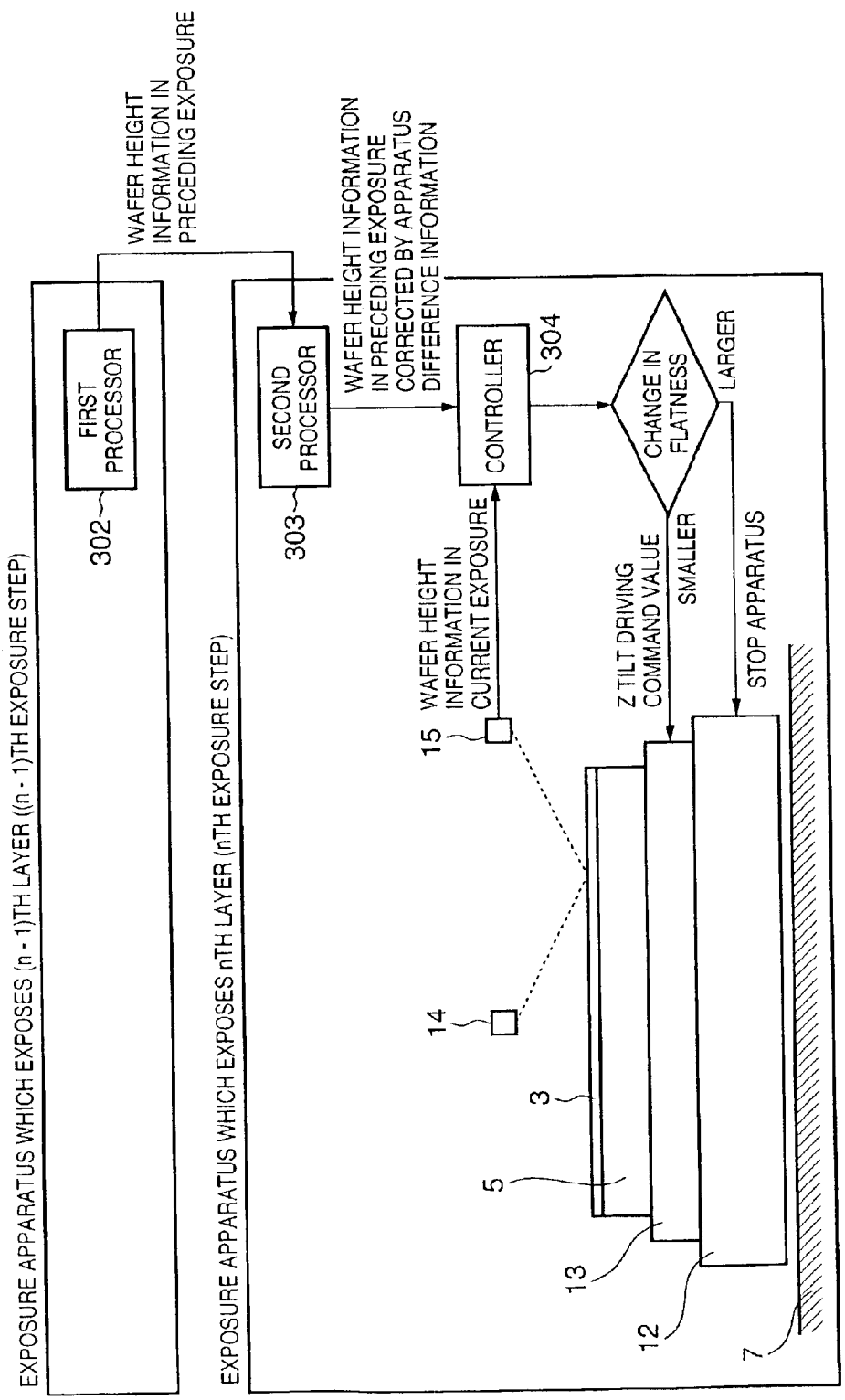
FIG. 6 is a schematic view showing a mix and match exposure operation in a semiconductor exposure apparatus according to another preferred embodiment of the present invention.

In FIG. 6, a wafer 3 serving as a substrate is held by a wafer chuck 5. The wafer chuck 5 is mounted on a Z tilt stage 13 used to align the wafer 3. The wafer chuck 5 and Z tilt stage 13 are mounted on an X-Y stage 12 used for movement between shots so that the irradiation region of exposure light can be sequentially stepped or scanned over a plurality of field angles of exposure of the wafer 3. The X-Y stage 12 is guided by a stage surface plate 7. To obtain the wafer height information, a light-projecting unit 14 diagonally projects light onto the surface of the wafer, and a light-receiving unit 15 receives light reflected by the wafer 3. The light-receiving unit 15 incorporates a CCD, or the like, and calculates the height of the wafer 3 from the barycentric position of the reflected light. The device to be incorporated in the light receiving unit 15 is not limited to the CCD. For example, a PSD may be incorporated instead. Additionally, the light-projecting unit 14 preferably projects light using an LD, LED, or the like. Though FIG. 5 shows only one set of the light-projecting unit 14 and the light-receiving unit 15, the semiconductor exposure apparatus may have a plurality of sets. A first processor 302 has a function of managing for each wafer the wafer height information obtained when the (n−1)th layer is exposed. The first processor 302 manages the wafer height information by, e.g., having a function of associating the height information of each wafer with identification information for identifying the wafer to store the associated information in a memory (not shown) and reading out the wafer height information in the preceding exposure step from the memory on the basis of the identification information. Note that the first processor 302 is arranged in an exposure apparatus, which exposed the (n−1)th layer. A second processor 303 is arranged in an exposure apparatus, which is ready to expose the nth layer. The second processor 303 obtains the (n−1)th wafer height information from the first processor 302 and performs exposure processing. The second processor 303 manages the wafer height information by, e.g., having a function of associating the height information of each wafer with identification information for identifying the wafer to store the associated information in a memory (not shown) and reading out the wafer height information in the preceding exposure step from the memory on the basis of the identification information, in the same manner as in the first processor 302. Additionally, a controller 304 obtains the wafer height information from the light-receiving unit 15 and the wafer height information which was obtained when the preceding layers (exposure steps) were exposed and is managed by the second processor 303 and determines the Z tilt correction amount for the Z tilt stage 13. A console (not shown) can be provided with the functions instead to be assigned to the first processor 302, second processor 303, or controller 304.

Care must be taken for operation of the second processor 303. Assume that the second processor 303 passes the wafer height information, which is obtained when the (n−1)th layer (exposure step) is exposed and supplied from the first processor 302, directly to the controller 304. In this case, since the relationship between the wafer height measurement information and the correction amount of the Z tilt stage 13 varies among apparatuses, high-accuracy AF setting or gap setting cannot be performed. This is because the same wafer 3 has different pieces of wafer height information. Typical factors for this include the flatness of the stage surface plate 7. Since the X-Y stage 12 is guided by the stage surface plate 7 to move, the wafer height information is substantially equivalent to the flatness of the stage surface plate 7, even if the flatness of the wafer 3 is zero. Additionally, since the flatness of the stage surface plate 7 varies among exposure apparatuses, the information on differences among apparatuses in the relationships among the respective pieces of wafer height information and the respective correction amounts must be managed in advance.

To this end, it is effective to employ a method of, e.g., performing pre-exposure for a preceding wafer once and obtaining the apparatus difference information from the exposure transfer accuracy to supply it as an offset to the second processor 303. The wafer height information obtained from a wafer formed only by coating a bare wafer with a photoresist has a measurement error of the smallest magnitude generated by the process. For this reason, if a wafer formed by coating a bare wafer with a photoresist is used as a preceding wafer to obtain in advance the relationship between the wafer height information and the resist image, the relationship between the wafer height information with respect to the resist image and the Z tilt correction amount can be obtained for each exposure apparatus. The second processor 303 only needs to manage the relationship between the obtained wafer height information and the obtained Z tilt correction amount as information on differences among apparatuses. Alternatively, the second processor 303 may calibrate the measurement result from the light-receiving units 15 of all the exposure apparatuses in the above-mentioned manner, instead of supplying an offset to the second processor 303.

The exposure apparatus which exposed the (n−1)th layer can serve as an exposure apparatus which exposes the (n+1)th layer. More specifically, the first processor 302 preferably has the same function as that of the second processor 303. For this reason, the processors of all the exposure apparatuses preferably manage the information on differences among the exposure apparatuses in the relationships between the respective pieces of wafer height information and the respective z tilt correction amounts. If an exposure apparatus to be used for exposure of a predetermined layer (exposure step) is determined in advance in the device manufacturing process, the processors only need to manage the differences among these exposure apparatuses along the flow of the device manufacturing.

With the above-mentioned method, the second processor 30 can manage the information on differences among apparatuses in the relationships among the respective pieces of wafer height measurement information and the respective correction amounts.

Next, a case will be described with reference to FIG. 6 wherein the nth layer is exposed in this embodiment.

The light-projecting unit 14 and light-receiving unit 15 first measure the height of the first shot or its vicinity of the wafer 3. Then, the second processor 303 corrects the above-mentioned apparatus difference to calculate the nth wafer height information on the basis of the wafer height information obtained by the light-projecting unit 14 and light-receiving unit 15 and the wafer height information up to the (n−1)th wafer height information obtained from the first processor 302. The controller 304 determines the Z tilt correction amount of the Z tilt stage 13 on the basis of the wafer height information calculated by the second processor 303.

In the above description, this determination is performed by adding the nth wafer height information and the wafer height information up to the (n−1)th wafer height information of the same wafer in a predetermined ratio, in the same manner as in the first embodiment. However, the present invention is not limited to this. The controller 304 may have an evaluation function for changing the ratio in accordance with each exposure step on the basis of the wafer height information in the preceding exposure steps and that in the current exposure step. For example, to determine the Z tilt correction amount, an evaluation function may be prepared to change the weights (ratio) of the nth wafer height information and the wafer height information up to the (n−1)th wafer height information in accordance with each layer (exposure step).

In addition, as the wafer height information up to the (n−1)th wafer height information, any of the first wafer height information up to the (n−1)th wafer height information may be employed. The correction amount in the Z tilt stage 13 may be substituted for the wafer height information and managed.

The controller 304 calculates a difference (change in flatness) between the nth wafer height information and the wafer height information up to the (n−1)th wafer height information. If the difference is equal to or more than a predetermined value, the operation of the apparatus is preferably stopped. In this case, a foreign substance may be present on the reverse surface of the wafer 3. The user preferably performs maintenance including cleaning of the wafer chuck 5.

In this embodiment, a console (not shown) can be provided with the functions to be assigned to the processor 301 or controller 304, as described above. However, this embodiment is not limited to this. A computer other than the console may have these functions. Additionally, in the above description, the controller 304 determines whether the difference between the nth wafer height information and the wafer height information up to the (n−1)th wafer height information is equal to or more than a predetermined value in the processing flow of the wafer height information and the Z tilt correction amount information in FIG. 6. However, the present invention is not limited to this. Another controller connected to the controller 304 may have this determination function. The controller 304 may determine the Z tilt correction amount after this determination. Alternatively, the controller 304 may determine the Z tilt correction amount only if the difference between the nth wafer height information and the wafer height information up to the (n−1)th wafer height information is equal to or less than the predetermined value.

In this embodiment, each exposure apparatus has the first processing means and second processing means. However, the present invention is not limited to this. For example, if a plurality of exposure apparatuses share and collectively manage a processor, each exposure apparatus need not have a processing means. In this case, each apparatus can acquire the substrate height information obtained when the preceding layers are exposed by accessing the processor or processors.

As can be seen from the above description, according to the present invention, alignment errors induced by the process can be reduced by aligning the wafer at a gap position or focus position on the basis of the wafer height information in the preceding exposure steps, as well as that in the current exposure step. As a result, the productivity of devices can be increased. In addition, since AF measurement accuracy, gap measurement accuracy, and the like, can be increased, the exposure transfer accuracy can be increased. This can also increase the productivity of devices.

If the difference between the height information of the first substrate and that of the second substrate is larger than a predetermined value, the operation of the apparatus can be stopped, and any foreign substance in a substrate holding unit can be detected at an early stage. Thus, the productivity including the yield of devices increases.

Moreover, the present invention can support not only a case wherein all the layers are exposed by one exposure apparatus, but also the mix & match scheme in which a plurality of exposure apparatuses are prepared, and one of them is selected in accordance with each layer (exposure step) to expose the layer.

Other Embodiment

Figure 7:
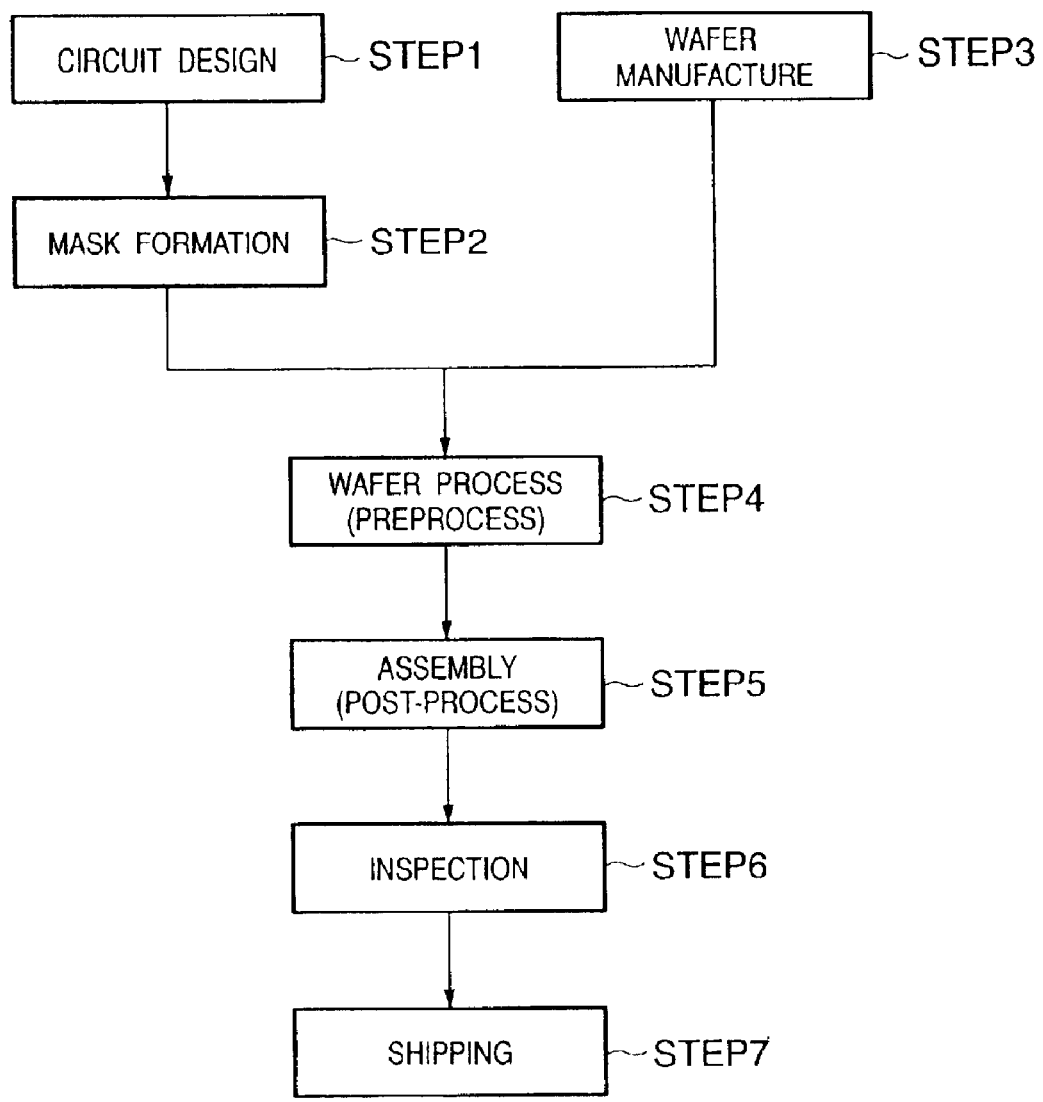
FIG. 7 is a flow chart showing the flow of the whole manufacturing process of a semiconductor device.

The manufacturing process of a semiconductor device using the above-mentioned exposure apparatus will be described next. FIG. 7 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process), called a preprocess, an actual circuit is formed on the wafer by lithography using the prepared mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 8:
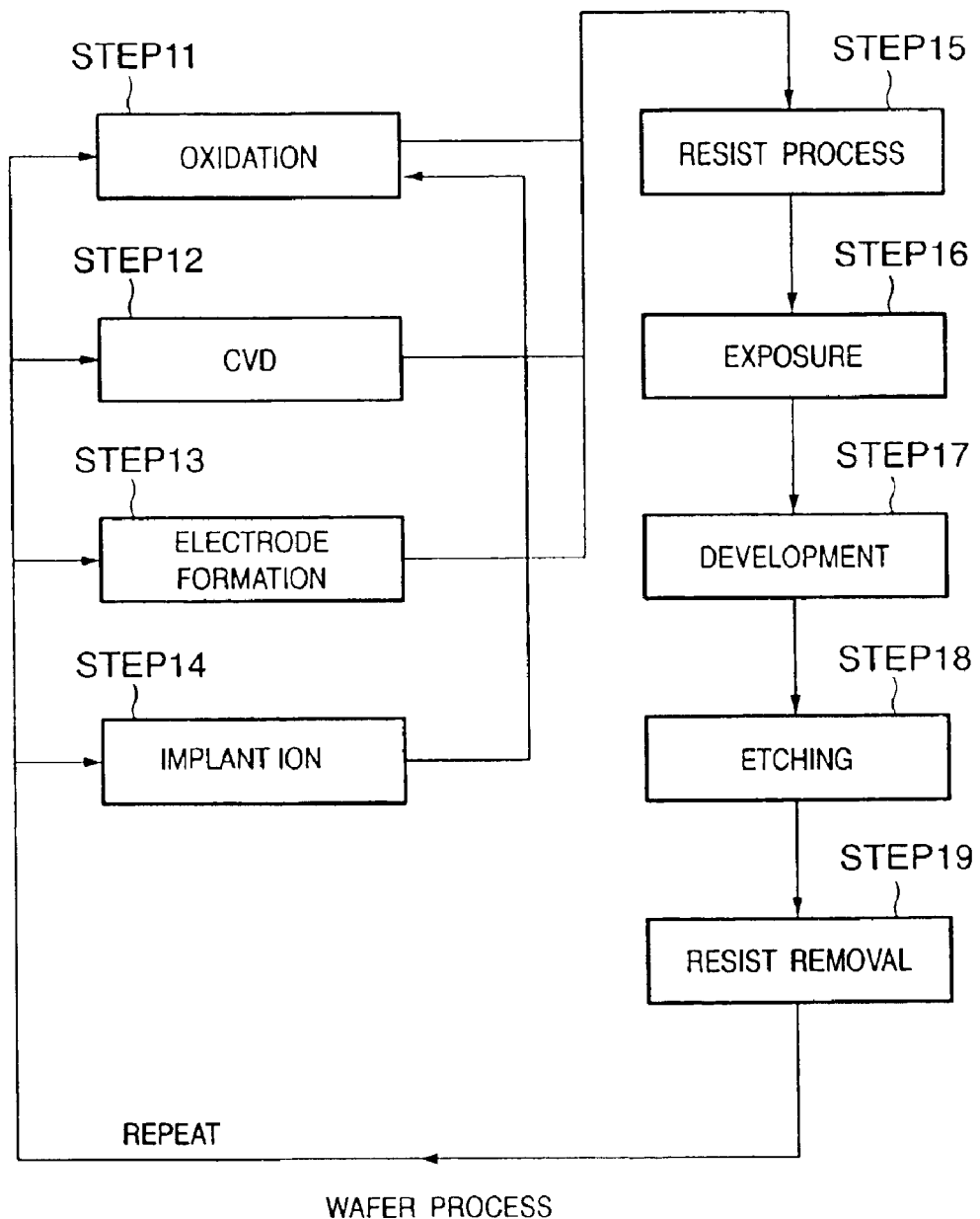
FIG. 8 is a flow chart showing the detailed flow of the wafer process.

FIG. 8 shows the detailed flow of the above-mentioned wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatus. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer.

As has been described above, the present invention can increase, e.g., the productivity of devices.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for performing a second transfer of a pattern of a second mask onto a second substrate, the second substrate having a layer formed through a first transfer of a pattern of a first mask onto a first substrate, said apparatus comprising:

a movable stage which holds the second substrate;

a measuring unit which measures a height of the second substrate relative to a plane at which the second substrate is to be exposed; and a control unit which controls a position of said stage based on the height measured by said measuring unit and a height of the first substrate previously measured relative to a plane at which the first substrate is to be exposed.

2. An apparatus according to claim 1, further comprising a processor and a memory, wherein said processor stores information of the height measured by said measuring unit in said memory.

3. An apparatus according to claim 2, wherein said processor stores the information on the height associated with identification information for identifying the substrate in said memory.

4. An apparatus according to claim 3, wherein said processor reads out the information of the height from said memory based on the identification information.

5. An apparatus according to claim 1, wherein said control unit stops operation of said apparatus if a difference between the height measured by said measuring unit and the height of the first substrate is greater than a predetermined value.

6. An apparatus according to claim 1, wherein said control unit controls the position of said stage based on a value obtained by weighted addition of the height measured by said measuring unit and the height of the first substrate.

7. An apparatus according to claim 1, wherein said control unit controls the position of said stage such that a distance between the second mask and the second substrate equals a predetermined value.

8. An apparatus according to claim 1, wherein said control unit controls the position of said stage so as to position the second substrate at a focus position of the pattern of the second mask.

9. An apparatus according to claim 1, further comprising an acquisition unit which acquires information of the height of the first substrate from an external apparatus different from said exposure apparatus.

10. An apparatus according to claim 9, wherein the external apparatus is one of an exposure apparatus which has performed the first transfer and a processor which is shared by a plurality of exposure apparatuses.

11. A device manufacturing method comprising steps of:
exposing a substrate to a pattern using an exposure apparatus as recited in claim 1; and
developing the exposed substrate.

12. An exposure method of performing a second transfer of a pattern of a second mask onto a second substrate, the second substrate having a layer formed through a first transfer of a pattern of a first mask onto a first substrate, said method comprising steps of:
holding the second substrate on a stage which moves;
measuring a height of the second substrate relative to a plane at which the second substrate is to be exposed; and
controlling a position of the stage based on the height measured in said measuring step and a height of the first substrate previously measured relative to a plane at which the first substrate is to be exposed.

* * * * *

UNITED STATES PATENT AND TRADEMARK OFFICE
CERTIFICATE OF CORRECTION

PATENT NO. : 6,876,438 B2
DATED : April 5, 2005
INVENTOR(S) : Toshinobu Tokita

It is certified that error appears in the above-identified patent and that said Letters Patent is hereby corrected as shown below:

Column 3,
Line 34, "heights," should read -- height, --.

Column 7,
Line 62, "since-" should read -- since --.

Column 10,
Line 3, "manners" should read -- manner --.
Line 57, "to be" should read -- of being --.

Column 11,
Line 41, "between" should read -- among --.

Signed and Sealed this

Thirtieth Day of August, 2005

JON W. DUDAS
*Director of the United States Patent and Trademark Office*